US010462908B2

(12) United States Patent
Khaselev et al.

(10) Patent No.: US 10,462,908 B2
(45) Date of Patent: Oct. 29, 2019

(54) CONDUCTIVE PATTERNS AND METHODS OF USING THEM

(71) Applicant: Alpha Assembly Solutions Inc., South Plainfield, NJ (US)

(72) Inventors: Oscar Khaselev, Monmouth Junction, NJ (US); Nitin Desai, Princeton Junction, NJ (US); Michael T. Marczi, Chester, NJ (US); Bawa Singh, Voorhees, NJ (US)

(73) Assignee: Alpha Assembly Solutions Inc., Waterbury, CT (US)

( * ) Notice: Subject to any disclaimer, the term of this patent is extended or adjusted under 35 U.S.C. 154(b) by 0 days.

(21) Appl. No.: 15/439,555

(22) Filed: Feb. 22, 2017

(65) Prior Publication Data

US 2017/0164484 A1    Jun. 8, 2017

Related U.S. Application Data

(62) Division of application No. 11/857,871, filed on Sep. 19, 2007, now Pat. No. 9,615,463.

(Continued)

(51) Int. Cl.
*H05K 1/02* (2006.01)
*H05K 1/09* (2006.01)

(Continued)

(52) U.S. Cl.
CPC ............... *H05K 3/125* (2013.01); *H05K 1/09* (2013.01); *H05K 3/0011* (2013.01); *H05K 3/1258* (2013.01); *H05K 3/22* (2013.01); *H05K 3/245* (2013.01); *H05K 2201/0203* (2013.01); *H05K 2201/0224* (2013.01);

(Continued)

(58) Field of Classification Search
CPC .. H05K 1/02; H05K 1/09; H05K 1/20; H05K 3/00; H05K 3/10; H05K 3/11; H05K 3/12; H05K 3/18; H05K 3/20; H05K 3/22; H05K 3/28; H05K 3/46; H05K 3/48;

(Continued)

(56) References Cited

U.S. PATENT DOCUMENTS 3,845,712 A     11/1974 Lewicki, Jr.
3,929,450 A  *  12/1975 Hamm .................... A01N 57/20
                                                                    504/127

(Continued)

FOREIGN PATENT DOCUMENTS

CN    1445820    10/2003
CN    1717964    1/2006

(Continued)

OTHER PUBLICATIONS

"Inkjet Printer" entry, Wikipedia, http://en.wikipedia.org/wiki/Inkjet_printer.

(Continued)

*Primary Examiner* — Xiaoliang Chen
(74) *Attorney, Agent, or Firm* — Stinson LLP

(57) ABSTRACT

Conductive patterns and methods of using and printing such conductive patterns are disclosed. In certain examples, the conductive patterns may be produced by disposing a conductive material between supports on a substrate. The supports may be removed to provide conductive patterns having a desired length and/or geometry.

6 Claims, 5 Drawing Sheets

Related U.S. Application Data

(60) Provisional application No. 60/826,605, filed on Sep. 22, 2006, provisional application No. 60/866,750, filed on Nov. 21, 2006.

(51) Int. Cl.

| | |
|---|---|
| H05K 3/00 | (2006.01) |
| H05K 3/10 | (2006.01) |
| H05K 3/12 | (2006.01) |
| H05K 3/18 | (2006.01) |
| H05K 3/20 | (2006.01) |
| H05K 3/22 | (2006.01) |
| H05K 3/28 | (2006.01) |
| H05K 3/46 | (2006.01) |
| H01L 21/02 | (2006.01) |
| H01L 21/44 | (2006.01) |
| H01L 21/48 | (2006.01) |
| H01L 23/48 | (2006.01) |
| B05D 3/02 | (2006.01) |
| H05K 3/24 | (2006.01) |

(52) U.S. Cl.
CPC ........... H05K 2201/09909 (2013.01); H05K 2203/013 (2013.01); H05K 2203/0568 (2013.01); H05K 2203/0769 (2013.01); H05K 2203/1131 (2013.01); H05K 2203/1476 (2013.01); Y10T 29/49155 (2015.01)

(58) Field of Classification Search
CPC ......... H01L 21/02; H01L 21/44; H01L 21/48; H01L 23/48; B05D 3/02
USPC ............... 174/250, 255, 258, 261, 371, 394; 29/877, 878; 438/106, 688, 29; 430/155, 430/506, 619; 422/128; 427/372.2, 427/376.6, 383.1
See application file for complete search history.

(56) References Cited

U.S. PATENT DOCUMENTS

| | | | | |
|---|---|---|---|---|
| 4,293,719 A | * | 10/1981 | Velenyi | C07C 409/08 568/565 |
| 4,486,356 A | * | 12/1984 | Bakel | A01N 47/42 562/17 |
| 4,495,363 A | * | 1/1985 | Franz | A01N 57/20 544/110 |
| 4,915,983 A | | 4/1990 | Lake et al. | |
| 4,942,114 A | * | 7/1990 | Shiba | G03C 1/8155 430/223 |
| 5,032,216 A | * | 7/1991 | Felten | B41M 1/12 216/83 |
| 5,073,791 A | * | 12/1991 | Mouri | G03F 7/0022 101/467 |
| 5,132,248 A | | 7/1992 | Drummond et al. | |
| 5,264,511 A | * | 11/1993 | Walton | C08F 38/00 526/247 |
| 5,360,704 A | * | 11/1994 | Brennecke | G03C 7/3022 430/503 |
| 5,368,894 A | * | 11/1994 | Lammers | B05D 7/52 427/202 |
| 5,395,742 A | * | 3/1995 | Deguchi | C07D 251/46 430/393 |
| 5,689,768 A | * | 11/1997 | Ehara | G03G 21/105 399/159 |
| 5,852,458 A | | 12/1998 | Scheffelin et al. | |
| 5,871,879 A | * | 2/1999 | Verlinden | B41N 1/14 428/157 |
| 6,074,893 A | * | 6/2000 | Nakata | H01L 21/4867 29/877 |
| 6,103,868 A | | 8/2000 | Heath | |
| 6,409,072 B1 | * | 6/2002 | Breuer | B01J 19/0093 156/60 |
| 6,534,723 B1 | * | 3/2003 | Asai | H01L 23/49811 174/255 |
| 6,849,800 B2 | * | 2/2005 | Mazurkiewicz | H01L 23/552 174/394 |
| 7,098,121 B2 | | 8/2006 | Mori et al. | |
| 7,220,682 B2 | | 5/2007 | Hirai | |
| 2002/0119079 A1 | * | 8/2002 | Breuer | B01J 19/0093 422/128 |
| 2002/0166680 A1 | * | 11/2002 | Mazurkiewicz | H01L 23/552 174/371 |
| 2002/0195217 A1 | * | 12/2002 | Johnson | D21H 25/18 162/160 |
| 2003/0071246 A1 | * | 4/2003 | Grigorov | C08F 8/44 252/500 |
| 2003/0155987 A1 | * | 8/2003 | Kolb | H04B 15/02 333/12 |
| 2003/0180610 A1 | * | 9/2003 | Felde | H01M 2/145 429/217 |
| 2003/0198734 A1 | * | 10/2003 | Mann | H05K 3/284 427/558 |
| 2003/0207561 A1 | | 11/2003 | Dubin et al. | |
| 2003/0217804 A1 | | 11/2003 | Guo et al. | |
| 2004/0082163 A1 | | 4/2004 | Mori et al. | |
| 2005/0095410 A1 | * | 5/2005 | Mazurkiewicz | H01L 23/552 428/209 |
| 2005/0129843 A1 | | 6/2005 | Wu | |
| 2005/0287691 A1 | * | 12/2005 | Chen | B82Y 10/00 438/29 |
| 2006/0014090 A1 | * | 1/2006 | Shiino | G03G 5/0605 430/59.1 |
| 2006/0019113 A1 | | 1/2006 | Sparks et al. | |
| 2006/0046361 A1 | | 3/2006 | Song et al. | |
| 2006/0154463 A1 | | 7/2006 | Furukawa et al. | |
| 2006/0118905 A1 | | 8/2006 | Himori et al. | |
| 2006/0181600 A1 | | 8/2006 | Bourdelais et al. | |
| 2006/0234505 A1 | * | 10/2006 | Asano | B82Y 10/00 438/688 |
| 2006/0245998 A1 | * | 11/2006 | Kahn | B82Y 30/00 423/592.1 |
| 2006/0254387 A1 | | 11/2006 | Lee et al. | |
| 2006/0255720 A1 | * | 11/2006 | Hirai | H01L 51/0005 313/503 |
| 2006/0256247 A1 | * | 11/2006 | Hirai | G02F 1/1368 349/42 |
| 2006/0261316 A1 | | 11/2006 | Jun et al. | |
| 2007/0065763 A1 | * | 3/2007 | Fukui | G03C 1/49854 430/619 |
| 2007/0194279 A1 | * | 8/2007 | Peng | C09K 11/02 252/301.4 F |
| 2008/0032047 A1 | * | 2/2008 | Parashar | B22F 1/0018 427/372.2 |

FOREIGN PATENT DOCUMENTS

| | | |
|---|---|---|
| CN | 1803351 | 7/2006 |
| EP | 0930641 | 7/1999 |
| JP | 2000332417 | 11/2000 |
| JP | 2002-016345 | 1/2002 |
| JP | 2002-141351 | 5/2002 |
| JP | 2003-103752 | 4/2003 |
| JP | 2005-166873 | 6/2005 |
| JP | 2005-223066 | 8/2005 |
| JP | 3796476 | 7/2006 |
| JP | 2006332051 | 12/2006 |
| KR | 20060120987 | 11/2006 |
| WO | 2006072959 | 7/2006 |
| WO | 2006076377 | 7/2006 |
| WO | 2007034922 | 3/2007 |
| WO | 2007040794 | 4/2007 |

OTHER PUBLICATIONS

International Search Report and Written Opinion for PCT/US07/78918.

(56) References Cited

OTHER PUBLICATIONS

Lee et al. "Direct Synthesis and Inkjetting of Silver Nanocrystals Toward Printed Electronics." Nanotechnology, 17 (2006), 2424-2428.

* cited by examiner

CONDUCTIVE PATTERNS AND METHODS OF USING THEM

PRIORITY APPLICATIONS

This application is a divisional application of U.S. patent application Ser. No. 11/857,871 filed Sep. 19, 2007, which claims priority to U.S. Provisional Application No. 60/826,605 filed on Sep. 22, 2006 and to U.S. Provisional Application No. 60/866,750 filed on Nov. 21, 2006, the entire disclosure of each of which is hereby incorporated herein by reference for all purposes.

FIELD OF THE TECHNOLOGY

Embodiments of the technology disclosed herein relate generally to conductive patterns and methods of using and printing them. More particularly, certain embodiments relate to electronic devices, such as printed circuit boards, that include one or more conductive patterns as disclosed herein.

BACKGROUND

Electronic devices include numerous connected electrical circuits. As the footprint of devices becomes smaller, the circuitry of the devices must be reduced to accommodate a desired footprint. Current methods used to produce circuits and conductors do not provide the precision to create narrow and thin conductors for use in many small electronic devices.

SUMMARY

In accordance with a first aspect, a device comprising at least one conductive pattern is disclosed. In certain embodiments, the conductive pattern may take the form of one or more conductive lines which may be electrically coupled to one or more other conductive lines. In certain examples, the conductive pattern may be produced by disposing a support on a substrate, disposing a conductive material between the support, and removing the support. Conductive patterns produced using such a method are referred to in some-instances herein as high-aspect ratio conductive patterns. In some examples the conductive material may be a metal particles, such as the capped metal particles described herein.

In accordance with an additional aspect, a substrate comprising at least one high-aspect ratio conductive pattern is provided. In certain examples, the substrate may be part of a printed circuit board. In some examples, the substrate may be formed from one or more pre-pregs that have been thermally treated. In other examples, the substrate may take the form of a laminate or a molded article. In certain embodiments, the conductive pattern may include one or more conductive lines which may be electrically coupled to one or more other conductive lines. The conductive pattern may be disposed horizontally along the plane of the substrate, vertically and substantially perpendicular to the plane of the substrate or at any angle to the plane of the substrate. In certain configuration a first high-aspect ratio conductive pattern may be electrically coupled to another conductor, which may be a high-aspect ratio conductive pattern, on an opposite or other face of the substrate.

In accordance with another aspect, a printed circuit board comprising at least one high aspect ratio conductive line is provided. In certain examples, the printed circuit board may be formed from one or more prepregs that include at least one high-aspect ratio conductive pattern disposed on one of the prepregs.

In accordance with another aspect, a method of producing a high-aspect ratio conductive pattern is disclosed. In certain examples, the method includes disposing a conductive material between a solid support. In certain examples, the solid support may include a defined spacing to provide a conductive pattern with a desired geometry, thickness or width. The method may also include removing the solid support to provide a high-aspect ratio conductive pattern. In certain examples, the solid support may be removed by thermal treatment, chemical treatment or other methods that may remove the solid support without damage to the conductive pattern. In certain examples, the solid support may include a anti-wetting coating to prevent or reduce the tendency of the ink to spread.

In accordance with another aspect, a method of producing a printed circuit board comprising at least one high-aspect ratio conductive pattern is provided. In certain examples, the method includes disposing a conductive material between a solid support on a prepreg, and removing the solid support from the prepreg to provide a high-aspect ratio conductive pattern. The method may also include thermally treating the prepreg with the at least one disposed high-aspect ratio conductive pattern to provide a printed circuit board.

In accordance with an additional aspect, a method of facilitating assembly of an electronic device is disclosed. In certain examples, the method comprises providing at least one ink comprising capped metal particles, and providing instructions for disposal of the at least one ink on a substrate to provide a high-aspect ratio conductive pattern on the substrate.

In accordance with another aspect, a method of printing a conductor using a printer is provided. In certain examples, the method comprises disposing a solid support material in a first reservoir of the printer on a substrate. In some examples, the method further comprises disposing an ink in a second reservoir of the printer between the disposed solid support material on the substrate. In certain examples, the method may also include removing the disposed solid support material from the substrate.

Additional features, aspects and examples are described in more detail below.

BRIEF DESCRIPTION OF THE FIGURES

Certain embodiments are described below with reference to the accompanying figures in which.

Figure 1:
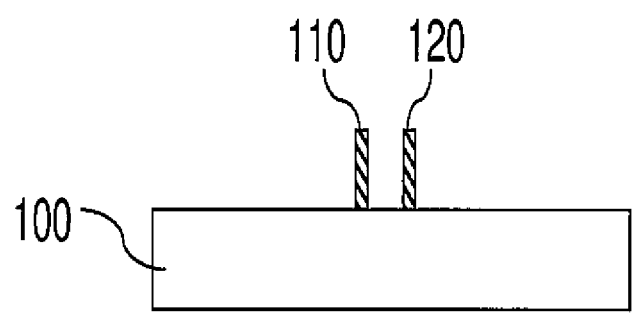
FIG. 1 is a drawing of solid supports disposed on a substrate, in accordance with certain examples.

Certain features shown in the figures may have been enlarged, distorted, altered or otherwise shown in non-conventional manner to facilitate a better understanding of the technology disclosed herein.

DETAILED DESCRIPTION

Certain embodiments of the devices and methods disclosed herein provide electrically conducting patterns having electrical properties not previously achieved with existing methods. High-aspect ratio conductive patterns may be produced on any type of electrical device in any desired pattern of selected thicknesses and widths. Illustrative high-aspect ratio conductive patterns are disclosed below.

Piezoelectric inkjet technology has advanced to become a key enabler in printed electronics. As an additive process, inkjet printing precisely controls the order and amount of fluids applied so expensive fluids and materials are not wasted. As an extended range of jettable nanoparticle conductive, semi-conductive, and adhesive fluids become commercially available, new opportunities for inkjet are emerging in the electronic industry.

Piezoelectric inkjet technology has advanced to become a key enabler in printed electronics. As an additive process, inkjet printing precisely controls the order and amount of fluids applied so expensive fluids and materials are not wasted. As an extended range of jettable nanoparticle conductive, semi-conductive, and adhesive fluids become commercially available, new opportunities for inkjet are emerging in the electronic industry.

One drawback in inkjet technology is printing of narrow (less than about 100 microns wide) and thick lines (more than about 2 microns thick). Normally to achieve required line thickness multiple printing passes are needed which could result in spreading the line beyond the required width. The phenomenon can be especially severe in the case of conducting metallic inks. Metal particles are much denser then the carrier media therefore most of the ink volume is taken by solvents which readily spread on the printed surface.

To prevent the ink spread common practice is the addition of rheology modifiers to increase the viscosity and tackiness of the ink. However, the addition of rheology modifiers (usually high boiling organic materials and polymers) to the conductive ink formulation may result in a significant degradation of the conductivity of the printed lines. This is especially true in the case of the metallic nanoparticle inks, such as those described in U.S. application Ser. No. 11/462,089, the entire disclosure of which is hereby incorporated herein by reference for all purposes. The sintering of nanoparticles into highly conductive lines relies on the intimate contact between the nanoparticles so addition of high boiling organic materials and polymers can impede or completely block the sintering process resulting in poor quality lines.

In accordance with certain examples, a method that provides for ink jet printing of fine patterns of any dimensions with inks of any viscosity to provide a high-aspect ratio conductive pattern is disclosed. The term "high-aspect ratio" refers to the electrical conductor as having a first dimension, e.g., a height, that is at least about five times greater than a second dimension, e.g., a width. In certain examples, the first dimension is at least about 10, 20, 30, 40, 50, 60, 70, 80, 90 or 100 times greater than the second dimension. The method used herein, however, may also be used to print conductive patterns having heights and widths that are substantially the same, e.g., 1:1 ratio of height:width or conductive patterns where the height is about twice that of the width, e.g., 2:1 ratio of height:width.

Figure 2:
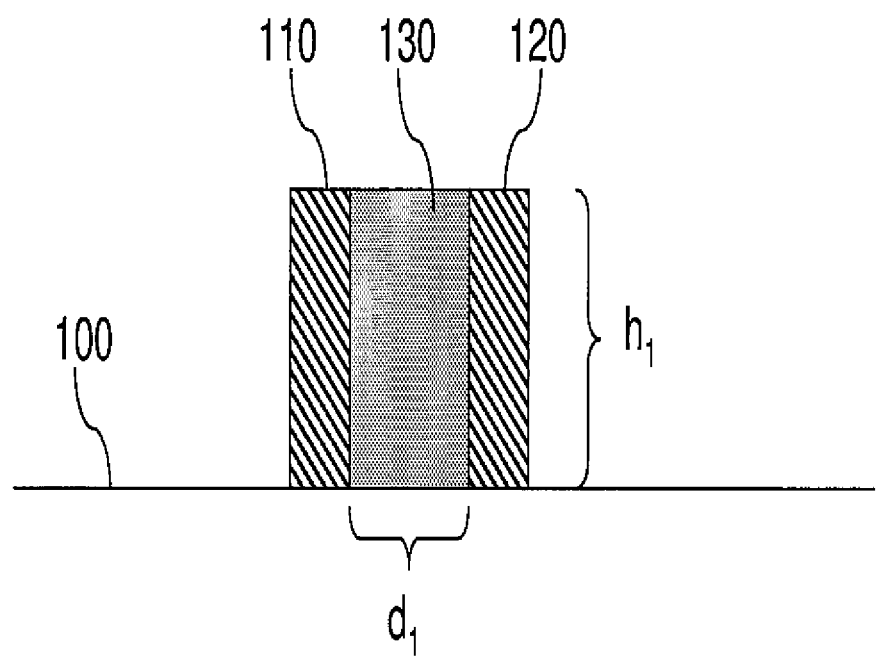
FIG. 2 is a drawing of a conductive material disposed between solid supports on a substrate, in accordance with certain examples.

In accordance with certain embodiments, the conductive material may be disposed between two or more supports. For example and referring to FIG. 1, a side-view of a substrate 100 is shown. A first solid support 110 and a second solid support 120 have been disposed on the substrate 100. Though solid supports 110 and 120 are shown as being disposed near the center of the substrate 100, the solid supports 110 and 120 may be disposed at any portion or area of the substrate 100. Subsequent to disposal of the solid support 110 and 120 on the substrate 110, a conductive material 130 may be disposed between the solid support 110 and 120, as shown in FIG. 2. The height $h_1$ of the solid supports and the distance $d_1$ between the solid supports generally determines the thickness and width of the conductive material, respectively. By decreasing the distance $d_1$, the width of the conductive pattern will decrease. By decreasing the height $h_1$, the thickness of the conductive pattern will decrease. The actual thickness and width of the conductive pattern may vary and illustrative thicknesses range from about 0.001 mm to about 0.1 mm and illustrative widths include, but are not limited to, 0.05 mm to about 0.3 mm. Additional thicknesses and widths will be readily selected by the person of ordinary skill in the art, given the benefit of this disclosure.

In accordance with certain examples, once the conductive material 130 is disposed between the solid supports 110 and 120, the conductive material may be subjected to one or more treatment steps. In examples where the conductive material is a an ink comprising capped metal particles, such as the ones described below, the ink may be sintered to condense the disposed material Other treatment steps include, but are not limited to, heating, grinding, chemical etching, and plasma etching. Additional treatment steps to provide high-aspect ratio conductive patterns will be readily selected by the person of ordinary skill in the art, given the benefit of this disclosure.

In accordance with certain examples, various methods may be used to dispose the solid supports onto a substrate. The exact method used to dispose the solid support material onto a substrate may vary depending on the nature and properties of the material selected for use in the solid support. In examples where the solid support is a polymeric material, the solid support may be disposed by inkjet printing, screen printing, or gravure printing. In examples where the solid support is a paper based material, an inorganic salt or an elastomer such as rubber, the solid support may be disposed or packed in a mold or form placed over the substrate. Other suitable materials for use in the solid support include, but are not limited to polymers, epoxy resins, inorganic/organic salts. In some examples when the solid support also provides anti-wetting properties it can be made of fluorinated polymers, such as Krytox fluids from Dupont or FluoroPel from Cytonix corporation. In some examples, the solid support may be disposed using an inkjet printer, such as an inkjet printer that may be used to dispose the conductive material. For example, the inkjet printer may include two or more reservoirs, one including the solid support material and the other including the ink to be printed between the solid supports. A first printing of the substrate may dispose the solid support material, and a second printing of the substrate may dispose the conductive material between the solid support material. Computer control of the printing operation may provide for known and precise disposal of both the solid support material and the ink.

Figure 3:
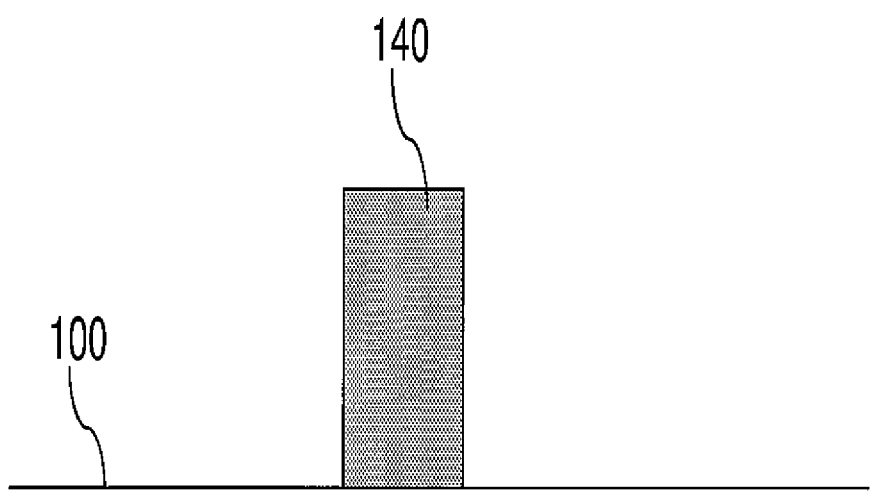
FIG. 3 is a drawing of a high-aspect ratio conductive pattern disposed on a substrate, in accordance with certain examples.

In accordance with certain examples, subsequent to disposal of the solid support material and the ink, the solid support material may be removed to provide a high-aspect ratio conductive pattern. In certain examples, the solid supports 110 and 120 may be removed from the substrate 100 to provide a high-aspect ratio conductive pattern 140, as shown in FIG. 3. The exact method or process used to remove the solid supports depends on the nature of the material or materials used in the solid supports. In examples where the solid support is a polymer, such as a plastic, the polymer may be stripped by washing it with organic solvents such as isopropyl alcohol or acetone or commercial strippers available for stripping photoresist films. In certain examples, the solid supports may be grinded or cut away with a CNC machine or other device that may remove the solid supports without substantial damage to the disposed conductive material. In examples where the solid support is paper, the solid supports may be burned or ashed and an air stream may be used to remove the residue from the conductive material. In certain examples, the solid support may be cast using an inorganic material, and, after disposition of the conductive material, the inorganic material may be dissolved away with a mild acid or base depending on the nature of the inorganic material. Illustrative inorganic materials include, but are not limited to, sodium chloride, potassium chloride, sodium nitrate and other water soluble salts.

Figure 4:
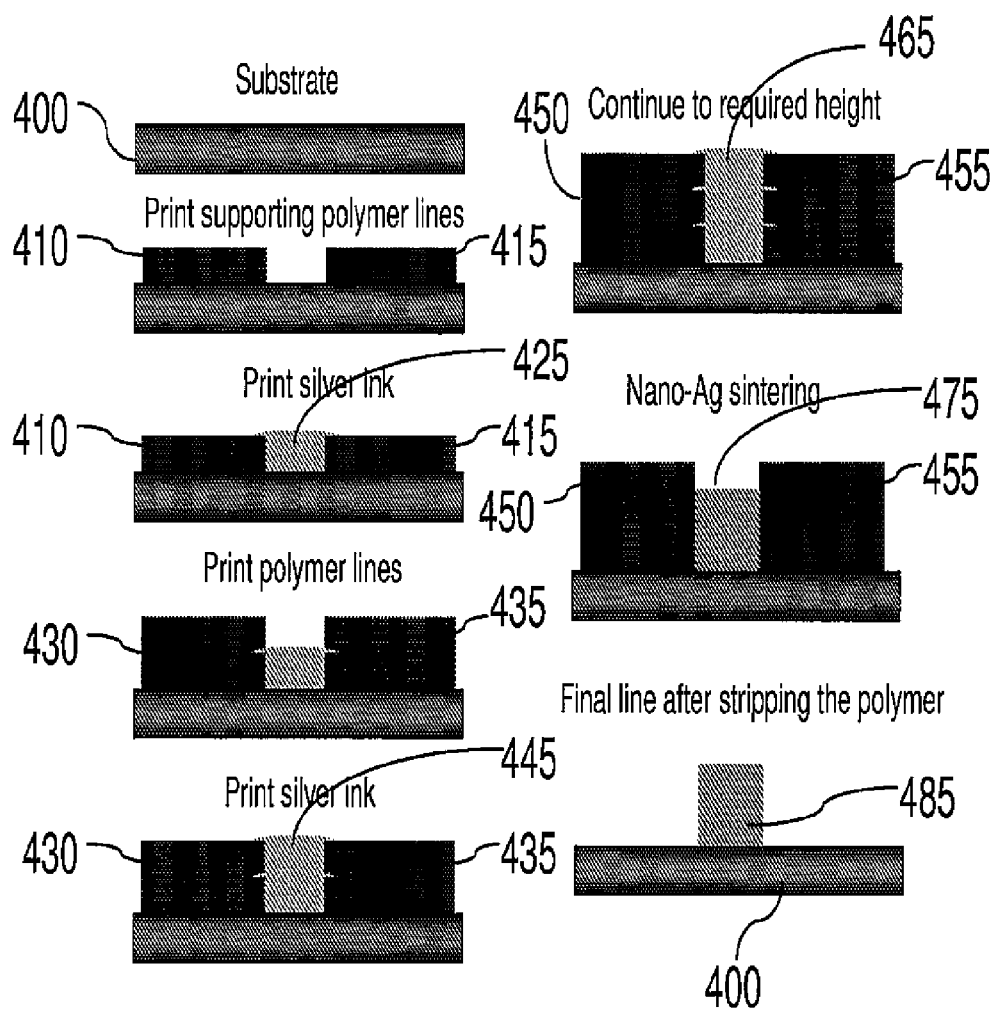
FIG. 4 shows a method for producing a high-aspect ratio conductive pattern, in accordance with certain examples.

In certain examples, the conductive material may be disposed step-wise, followed by subsequent disposal of more solid support material and subsequent disposal of additional conductive material. This process may be useful, for example, where it is desirable to achieve a conductive material thickness greater than is capable with a single application. An illustration of this process is shown schematically in FIG. 4. A substrate 400 is shown in FIG. 4, and a polymeric solid support material along with a conductive nanosilver ink is shown as being used. In a first step, supporting polymer line 410 and 415 are printed on the substrate 400. A silver ink 425 is printed between solid support lines 410 and 415 until it reaches the top of solid support lines 410 and 415. Additional solid support material is disposed on lines 410 and 415 to provide solid support lines 430 and 435. Additional ink 445 is disposed between solid support lines 430 and 435 until the ink reaches the top of the solid support lines 430 and 435. Another step of disposing additional solid support material to provide solid support lines 450 and 455 followed by disposal of additional ink 465 may also be performed. This process of disposing solid support material followed by disposal of ink may be continued until a desired thickness is reached. Once a desired thickness is reached, sintering may be performed to condense the ink 465 to a sintered ink 475. Subsequent to sintering, solid support lines 450 and 455 may be removed by washing the substrate in, for example, isopropyl alcohol, acetone or a mixture thereof to leave a substrate 400 having a high-aspect ratio conductive pattern 485.

In accordance with certain examples, inks suitable for use in the methods disclosed herein include, but are not limited to, any ink suitable for use in inkjet printing applications. Illustrative inks and particles for use in such inks are discussed below. Additional suitable inks will be readily selected by the person of ordinary skill in the art, given the benefit of this disclosure.

In accordance with certain examples, the ink may include silver particles dispersed in a suitable solvent system. Silver particles are well known materials and available from different commercial sources. Normally, the size of particles ranges from 5 to 70 nm. The known advantage of particles compared to regular silver powder is their ability to be heated or sintered in solid structures at temperatures much lower then melting temperatures. The silver particles can be heated, for example, at temperatures as low as 200° C. The heating process is a diffusion process in which silver migrates from particle to particle forming connecting bridges between particles. The structures formed by heating of currently available silver particles are conductive, but their conductivity is still much lower then that of bulk silver. The reported conductivity is in the range of $1-2*10^4$ S/cm compared to $62*10^4$ S/cm for the bulk silver. There remains a need for silver films whose conductivity is much closer to that of bulk silver.

In accordance with certain examples, particles suitable for use in the inks disclosed herein may be produced by mixing at least one metal or metal salt and a capping agent in a single phase solution or in a multi-phase solution. In certain examples, the metal or metal salt may be selected from conductive metals or conductive metal salts including, for example, transition metals or transition metal salts of gold, silver, copper, nickel, platinum, palladium, iron, and alloys thereof. The exact form of the metal or metal salt may vary depending on the selected solvent system. It is desirable that the metal salt dissolve in the selected solvent system without undue heating that could result in evaporation of the solvent. Illustrative anions of the metal salts include nitrate, chloride, bromide, iodide, thiocyanate, chlorate, nitrite, and acetate. Additional anions are disclosed below in reference to the particular illustrative metal salts disclosed.

In certain examples, the use of a single phase solution to produce the particles permits omission of a phase transfer reagent (though a phase transfer reagent may still be used in certain embodiments) that is commonly used to produce particles in a polyol process. By performing the reaction in a single phase, the ease of producing the particles increases, and the cost of producing the particles decreases. In addition, large scale, industrial synthesis of the particles may be achieved using a single phase reaction. Additional benefits of the particles, and methods of producing them, will be readily selected by the person of ordinary skill in the art, given the benefit of this disclosure.

In accordance with certain examples, a silver salt may be used to provide particle suitable for use in the inks disclosed herein. In instances where a silver salt is used, the silver salt may be one or more of silver chloride, silver bromide, silver iodide, silver thiocyanate, silver sulfate, silver chromate, silver phosphate, silver oxalate, silver carbonate, silver sulfite, silver hydroxide, silver nitrate, silver chlorate, silver acetate, silver nitrite, silver acetylacetonate, silver lactate, silver (II) fluoride, silver (I) hydrogenfluoride, silver (I) permanganate, silver metavanadate, silver trifluoroacetate, potassium dicyanoargentate, silver benzoate, silver arsenate, silver bromate, silver cyclohexanebutyrate, silver fluorosulfate, silver hexafluoroantimonate (V), silver hexafluoroarsenate (V), silver hexafluorophosphate, silver (I) fluoride, silver (I) oxide, silver (I) perrhenate, silver (I) selenide, silver (I) telluride, silver iodate, silver orthophosphate, silver sulfide, and silver tungstate. Additional suitable silver salts will be readily selected by the person of ordinary skill in the art, given the benefit of this disclosure.

In accordance with certain examples, a gold salt may be used to provide particles suitable for use in the inks disclosed herein. In instances where a gold salt is used, the gold salt may be one or more of gold (III) chloride hydrate, hydrogen tetrachloroaurate (III) hydrate, chloro(dimethylsulfide) gold (I), gold (I) chloride, gold colloid, gold (I) cyanide, gold (I) iodide, gold (I) sulfide, gold (III) bromide hydrate, gold (III) chloride, gold (III) chloride trihydrate, gold (III) hydroxide, gold (III) oxide hydrate, gold (III) sulfide, potassium dicyanoaurate (I), potassium gold (III)

chloride, and sodium tetrachloroaurate (III) dehydrate. Additional suitable gold salts will be readily selected by the person of ordinary skill in the art, given the benefit of this disclosure.

In accordance with certain examples, a copper salt may be used to produce particles suitable for use in the inks disclosed herein. In instances where a copper salt is used, either the cuprous form (copper (I)) or the cupric form (copper (II)) may be used. Illustrative copper salts include, but are not limited to, copper (I) chloride, copper (II) chloride, copper (I) bromide, copper (II) bromide, copper (I) iodide, copper (II) iodide, copper mercuric iodide, copper (I) tetraiodomercurate (II), cuprous thiocyanate, copper (II) sulfate, copper (II) acetylacetonate, ammonium tetrachlorocuprate (II) dihydrate, copper aluminum oxide, copper chromite, ethylenediaminetetraacetic acid diammonium copper salt solution, ethylenediaminetetraacetic acid copper (III) disodium salt, copper (I) acetate, copper (I) cyanide, copper (I) oxide, copper (I) selenide, copper (I) sulfide, copper (I) telluride, copper (I) thiophenolate, copper (II) acetate, copper(II) acetate hydrate copper (II) acetate monohydrate, copper (II) carbonate, copper (II) hydroxide, copper (II) molybdate, copper (II) niobate, copper (II) nitrate, copper (II) selenide, copper (II) selenite dehydrate, copper (II) sulfate, copper (II) sulfide, copper (II) telluride, tris(ethylenediamine) copper (II) sulfate, and combinations thereof. Additional suitable copper salts will be readily selected by the person of ordinary skill in the art, given the benefit of this disclosure.

In accordance with certain examples, an aluminum salt may be used to provide particles suitable for use in the inks disclosed herein. In instances where an aluminum salt is used, the aluminum salt may be, for example, one or more of aluminum acetate, aluminum phosphate monobasic, aluminum sulfate, aluminum ethoxide, aluminum potassium sulfate, aluminum silicate, aluminum acetate, aluminum arsenide, aluminum bromide, aluminum chloride, aluminum chloride hydrate, aluminum fluoride, aluminum fluoride hydrate, aluminum fluoride trihydrate, aluminum hydroxide, aluminum iodide, aluminum sulfide, aluminum nitrate, aluminum thiocyanate, aluminum chlorate, and aluminum nitrite. Additional suitable aluminum salts will be readily selected by the person of ordinary skill in the art, given the benefit of this disclosure.

In accordance with certain examples, a platinum salt may be used to produce particles suitable for use in the inks provided herein. In instances where a platinum salt is used, the platinum salt may be, for example, one or more of platinum (II) acetylacetonate, platinum (IV) chloride, platinum (IV) oxide, platinum (II) bromide, platinum (II) chloride, platinum (II) cyanide, platinum (II) hexafluoroacetylacetonate, platinum (II) iodide, platinum (IV) sulfide, and platinum nitrate. Additional suitable platinum salts will be readily selected by the person of ordinary skill in the art, given the benefit of this disclosure.

In accordance with certain examples, a palladium salt may be used to produce particles suitable for use in the inks disclosed herein. In instances where a palladium salt is used, the palladium salt may be, for example, one or more of palladium (II) acetylacetonate, palladium(II) trifluoroacetate, palladium hydroxide, palladium (ID acetate, palladium(II) bromide, palladium (II) chloride, palladium(II) cyanide, palladium(II) hexafluoroacetylacetonate, palladium(II) iodide, palladium(II) nitrate dehydrate, palladium(II) nitrate hydrate, palladium(II) oxide, palladium (II) propionate, palladium (II) sulfate, palladium (II) sulfide, and palladium on alumina. Additional suitable palladium salts will be readily selected by the person of ordinary skill in the art, given the benefit of this disclosure.

In accordance with certain examples, a cobalt salt may be used to produce particles suitable for use in the inks disclosed herein. In instances where a cobalt salt is used, the cobalt salt may be, for example, one or more of ammonium cobalt (II) sulfate hexahydrate, cobalt chloride, cobalt (II) acetate, cobalt (II) acetate tetrahydrate, cobalt (II) acetylacetonate, cobalt (II) acetylacetonate hydrate, cobalt (II) bromide, cobalt (ID chloride, cobalt (II) chloride hexahydrate, cobalt (II) chloride hydrate, cobalt (II) cyanide dehydrate, cobalt (II) iodide, cobalt (II) thiocyanate, cobalt (II) nitrate hexahydrate, and cobalt (III) acetylacetonate. Additional suitable cobalt salts will be readily selected by the person of ordinary skill in the art, given the benefit of this disclosure.

In accordance with certain examples, a chromium salt may be used to produce particles suitable for use in the inks disclosed herein. In instances where a chromium salt is used, the chromium salt may be, for example, one or more of chromium (III) acetylacetonate, chromium (II) acetate, chromium (ID chloride, chromium (II) fluoride, chromium (II) selenide, chromium (III) acetate hydroxide, chromium (III) bromide hexahydrate, chromium (III) chloride, chromium (III) chloride hexahydrate, chromium (III) chloride hydrate, chromium (III) fluoride, chromium (III) sulfate hydrate, chromium (III) telluride, chromium silicide, and chromium nitrate. Additional suitable chromium salts will be readily selected by the person of ordinary skill in the art, given the benefit of this disclosure.

In accordance with certain examples, an indium salt may be used to produce particles suitable for use in the inks disclosed herein. In instances where an indium salt is used, the indium salt may be, for example, one or more of indium (III) acetylacetonate, indium antimonide, indium (I) bromide, indium (I) chloride, indium (I) iodide, indium (II) chloride, indium (III) acetate, indium (III) acetate hydrate, indium (III) bromide, indium (III) chloride, indium (III) chloride hydrate, indium (III) chloride tetrahydrate, indium (III) fluoride, indium (III) fluoride trihydrate, indium (III) hydroxide, indium (III) iodide, indium (III) nitrate hydrate, indium (III) nitrate hydrate, indium (III) nitrate pentahydrate, indium (III) nitride, indium (III) oxide, indium (III) perchlorate hydrate, indium (III) selenide, indium (III) sulfate, indium (III) sulfate hydrate, and indium (III) telluride. Additional suitable indium salts will be readily selected by the person of ordinary skill in the art, given the benefit of this disclosure.

In accordance with certain examples, a nickel salt may be used to produce particles suitable for use in the inks disclosed herein. In instances where a nickel salt is used, the nickel salt may be, for example, one or more of nickel (II) acetylacetonate, nickel (II) acetate tetrahydrate, nickel (II) carbonate hydroxide tetrahydrate, nickel (II) octanoate hydrate, nickel sulfide, nickel carbonate, nickel (II) bromide, nickel (II) bromide hydrate, nickel (II) bromide trihydrate, nickel (II) carbonate basic hydrate, nickel (II) chloride, nickel (II) chloride hexahydrate, nickel (II) chloride hydrate, Nickel (II) cyclohexanebutyrate, nickel (II) fluoride, nickel (II) fluoride tetrahydrate, nickel (II) hexafluoroacetylacetonate hydrate, nickel (II) hydroxide, nickel (II) iodide, nickel (II) molybdate, nickel (II) nitrate hexahydrate, nickel (II) oxalate dehydrate, nickel (II) oxide, nickel (II) perchlorate hexahydrate, nickel (II) peroxide hydrate, nickel (II) phosphide, nickel (II) stearate, nickel (II) sulfate hexahydrate, and nickel on silica. Additional suitable nickel salts will be readily selected by the person of ordinary skill in the art, given the benefit of this disclosure.

In accordance with certain examples, an iridium salt may be used to produce particles suitable for use in the inks disclosed herein. In instances where an iridium salt is used, the iridium salt may be, for example, one or more of iridium (III) acetylacetonate, iridium (III) bromide hydrate, iridium (III) chloride, iridium (III) chloride hydrate, iridium (III) chloride hydrochloride hydrate, iridium (IV) chloride hydrate, iridium (IV) oxide, iridium (IV) oxide hydrate and iridium nitrate. Additional suitable iridium salts will be readily selected by the person of ordinary skill in the art, given the benefit of this disclosure.

In accordance with certain examples, a rhodium salt may be used to produce particles suitable for use in the inks disclosed herein. In instances where a rhodium salt is used, the rhodium salt may be, for example, one or more of rhodium (III) acetylacetonate, rhodium (II) acetate dimmer, rhodium (II) acetate dimer dehydrate, rhodium (II) heptafluorobutyrate, rhodium (II) hexanoate, Rhodium (II) octanoate dimer, rhodium (II) trifluoroacetate dimer, rhodium (II) trimethylacetate dimer, rhodium (III) bromide hydrate, rhodium (III) chloride, rhodium (III) chloride hydrate, rhodium (III) iodide hydrate, rhodium (III) nitrate hydrate, rhodium (III) oxide, rhodium (III) oxide hydrate, rhodium (III) phosphate solution, sodium hexachlororhodate (III) dodecahydrate, rhodium (III) sulfate solution, rhodium (IV) oxide, rhodium on activated alumina, rhodium on activated charcoal, tris(ethylenediamine) rhodium (III) chloride, and tris(ethylenediamine)-rhodium (III) nitrate. Additional suitable rhodium salts will be readily selected by the person of ordinary skill in the art, given the benefit of this disclosure.

In accordance with certain examples, an osmium salt may be used to produce particles suitable for use in the inks disclosed herein. In instances where an osmium salt is used, the osmium salt may be, for example, one or more of osmium (III) chloride hydrate, osmium tetrachloride, osmium tetroxide, osmium trichloride and tetra-osmiumnitrate. Additional suitable osmium salts will be readily selected by the person of ordinary skill in the art, given the benefit of this disclosure.

In accordance with certain examples, an iron salt may be used to produce particles suitable for use in the inks disclosed herein. In instances where an iron salt is used, the iron salt may be, for example, one or more of iron (III) acetylacetonate, iron (II) acetylacetonate, iron ascorbate, ammonium iron (II) sulfate hexahydrate, iron (III) citrate tribasic monohydrate, iron (II) gluconate dehydrate, iron (III) pyrophosphate, iron (II) phthalocyanine, iron (III) phthalocyanine chloride, ammonium iron (III) citrate, ammonium iron (II) sulfate, ammonium iron (III) sulfate, ammonium iron (III) sulfate dodecahydrate, iron (III) chloride, iron (III) bromide, iron (III) chloride hexahydrate, ferric citrate, iron (III) fluoride, iron (III) nitrate nonahydrate, iron (III) oxide, iron (III) phosphate, iron (III) sulfate hydrate, iron (II) bromide, iron (II) chloride, iron (III) phosphate hydrate, iron (III) phosphate tetrahydrate, iron (II) chloride hydrate, iron (II) chloride tetrahydrate, iron (II) ethylenediammonium sulfate tetrahydrate, iron (II) fluoride, iron (II) gluconate hydrate, iron (II) iodide, iron (II) lactate hydrate, iron (II) oxalate dehydrate, ferrous sulfate heptahydrate, iron (II) sulfide, iron (II) acetate, iron (II) fluoride tetrahydrate, iron (II) iodide tetrahydrate, iron (II) molybdate, iron (II) oxide, iron (II) perchlorate hydrate, iron (II) titanate, and iron (III) ferrocyanide. Additional suitable iron salts will be readily selected by the person of ordinary skill in the art, given the benefit of this disclosure.

In accordance with certain examples, a ruthenium salt may be used to produce particles suitable for use in the inks disclosed herein. In instances where a ruthenium salt is used, the ruthenium salt may be, for example, one or more of ruthenium (III) acetylacetonate, ruthenium (IV) oxide, ammonium hexachlororuthenate (IV), ruthenium (III) chloride, ruthenium on activated charcoal, ruthenium on alumina, ruthenium on carbon, ruthenium (III) bromide, ruthenium (III) chloride hydrate, ruthenium (III) chloride trihydrate, ruthenium (III) iodide, ruthenium (III) nitrosyl chloride hydrate, ruthenium (III) nitrosyl nitrate solution, and ruthenium (IV) oxide hydrate. Additional suitable ruthenium salts will be readily selected by the person of ordinary skill in the art, given the benefit of this disclosure.

In accordance with certain examples, the metal used to provide the particles for use in the inks disclosed herein may be uncomplexed or may be complexed with one or more ligands. For example, the metal may be complexed with EDTA, ethylenediamine, oxalate, 2,2'-bypyridine, cyclopentadiene, diethylenetriamine, 2,4,6,-trimethylphenyl, 1,10-phenanthroline, triethylenetetramine or other ligands.

In accordance with certain examples, the inks disclosed herein may include two or more different metal particles suspended in a solvent system. For example, an illustrative ink may include both capped silver particles and capped gold particles each suspended in a suitable solvent system.

In certain examples, the metal or metal salt may be dissolved in one or more of the solvent systems to provide a clear, but not necessarily colorless, solution. For example, a suitable amount of metal or metal salt may be added to a solvent or a solvent system such that when the metal or metal salt goes into solution, the overall solution is clear. The overall solution may be colored or may be colorless. In certain examples, the combination of solvents provides a single phase. To achieve a single phase when using a solvent system, the amounts of each solvent may be adjusted such that a single phase results when the solvents are mixed. Should more than one phase be present upon mixing, the relative amounts of one or more of the solvents can be altered, e.g., increased or decreased, until a single phase is observed. Alternatively, a third solvent may be added to increase the miscibility of the first and second solvent.

In accordance with certain examples, the particles may also be produced by adding a capping agent to the metal salt dissolved in the solvent or solvent system. The capping agent may be effective to isolate the particle and limit the size of its growth. In certain examples, the capping agent is a high molecular weight capping agent, e.g., has a molecular weight of at least about 100 g/mole. Illustrative capping agents include, but are not limited to, organic amines having about 12 or more carbon atoms. In certain examples, the organic amine has at least about 16 carbon atoms, e.g., hexadecylarnine. The organic moiety of the amine may be saturated or unsaturated and may optionally include other functionalities such as, for example, thiols, carboxylic acids, polymers, and amides. Another group of illustrative capping agents suitable for use in the methods disclosed herein are thiols having about 12 or more carbon atoms. In certain examples, the thiol has at least about 6 carbon atoms. The organic moiety of the thiol may be saturated or unsaturated and may optionally include other functionalities such as, for example, pyrrole and the like. Another group of capping agents suitable for use are pyridine based capping agent such as, for example, triazolopyridine, terpyridine and the like.

Additional suitable capping agents will be readily selected by the person of ordinary skill in the art, given the benefit of this disclosure.

In certain examples where a capping agent is used, the capping agent may be dissolved in a suitable solvent or solvent system prior to addition to the metal solution. For example, the capping agent may be dissolved in a solvent and the solution can be mixed with the metal solution. In other examples, the capping agent may be added as a solid or liquid directly to the metal solution without prior dissolution in a solvent. The capping agent may be added, for example, in incremental steps or may be added in a single step.

In accordance with certain examples, the amount of capping agent added to the metal solution may vary depending on the desired properties of the resulting capped particles. In some examples, a suitable amount of capping agent is added to provide at least about 2% by weight capping agent in the capped particles. It will be recognized by the person of ordinary skill in the art, given the benefit of this disclosure, that it may be desirable to use more or less capping agent depending on the desired properties of the particles and/or the desired properties of the ink. For example, to increase the conductivity of particles disposed on a substrate, e.g., a printed wiring board, it may be desirable to adjust the amount of capping agent until the conductivity is optimized or falls within a desired range. It will be within the ability of the person of ordinary skill in the art, given the benefit of this disclosure, to select suitable amounts of capping agent.

In certain examples, when a capping agent (or a capping agent solution) and the metal salt solution are mixed, a single phase results or remains. In an alternative embodiment, the metal salt solution may be a single phase prior to addition of the capping agent or capping agent solution, and, upon addition of the capping agent or capping agent solution a single phase remains. Additional embodiments where a metal solution and a capping agent are mixed to provide a single phase will be readily selected by the person of ordinary skill in the art, given the benefit of this disclosure.

In certain examples, the capping agent and the metal solution may be mixed using conventional techniques such as stirring, sonication, agitation, vibration, shaking or the like. In some examples, the capping agent is added to the metal solution while the metal solution is being stirred. In certain examples, the mixture of capping agent and metal solution may be stirred until a clear and/or colorless single phase solution results.

In accordance with certain examples, the particles may also be produced by adding a reducing agent to the metal-capping agent solution. Suitable reducing agents include agents that can convert the metal ions dissolved in the solution to metal particles that, under selected conditions, will precipitate out of solution. Illustrative reducing agents include, but are not limited to, sodium borohydride, lithium aluminum hydride, sodium cyanoborohydride, potassium borohydride, sodium triacetoxyborohydride, sodium diethyldihydridoaluminate, sodium tri- or tert-butoxohydridoaluminate, sodium bis(2-methoxyethoxo) dihydridoaluminate, lithium hydride, calcium hydride, titanium hydride, zirconium hydride, diisobutylaluminum dydride (DIBAL-H), dimethylsulfide borane, ferrous ion, formaldehyde, formic acid, hydrazines, hydrogen gas, isopropanol, phenylsilane, polymethylhydrosiloxane, potassium ferricyanide, silanes, sodium hydrosulfite, sodium amalgam, sodium (solid), potassium (solid), sodium dithionite, stannous ion, sulfite compounds, tin hydrides, triphenylphosphine and zinc-mercury amalgam. The exact amount of reducing agent added to the metal-capping agent solution may vary, but typically the reducing agent is added in excess such that substantially all of the dissolved metal is converted from a charged state to an uncharged state, e.g., $Ag^{+1}$ is converted to $Ag^0$.

In some examples, the reducing agent is dissolved in a solvent prior to addition to the metal-capping agent solution, whereas in other examples, the reducing agent is added to the metal-capping agent solution without prior dissolution. When a solvent is used to dissolve the reducing agent, the solvent is preferably non-reactive such that the solvent is not altered or changed by the reducing agent. Illustrative solvents for use with the reducing agent include, but are not limited to, tetrahydrofuran (THF), N,N-dimethylformamide (DMF), ethanol, toluene, heptane, octane and solvents having six or more carbon atoms. The person of ordinary skill in the art, given the benefit of this disclosure, will be able to select suitable solvent for dissolving the reducing agent.

In accordance with certain examples, the reducing agent and capping agent-metal solution may be mixed or stirred for a sufficient time to permit reaction of the reducing agent with the metal. In some examples, the stirring may be performed at room temperature, whereas in other examples the stirring or mixing is performed at an elevated temperature, e.g., about 30° C. to about 70° C., to speed the reduction process. When an elevated temperature is used, it is desirable to keep the temperature below the boiling point of the solvent or solvent system to reduce the likelihood of solvent evaporation, though in some examples, it may be desirable to reduce the overall volume of solvent.

In accordance with certain examples, the particles may also be produced by isolating the capped metal particles from the single phase solution. Isolation may occur, for example, by decanting, centrifugation, filtering, screening or addition of another liquid that the capped metal particles are insoluble in, e.g., extraction. For example, a liquid, such as methanol, acetone, water or a polar liquid, may be added to an organic solution obtained from adding metal salt, capping agent and reducing agent to an organic solvent or organic solvent system. In certain examples, multiple, separate additions of the extraction liquid may be added to the solution to remove the capped metal particles. For example, a first amount of extraction liquid may be added to remove some of the metal particles. This first amount of extraction liquid may then be removed, decanted or otherwise separated from the organic solution, and additional amounts of the extraction liquid may be added to the organic solution. The exact amount of extraction liquid used to isolate the metal particles may vary depending on the volume of solvent used to produce the capped metal particles. In some examples, about two to four times or more solvent is used to extract the capped metal particles, e.g., if the metal particles are produced in about five Liters of solvent, then about 20 Liters or more of extraction liquid may be used. It will be within the ability of the person of ordinary skill in the art, given the benefit of this disclosure, to select suitable solvents and amounts of suitable solvents.

In accordance with certain examples, the capped particles may be separated from the extraction liquid using conventional techniques such as decanting, centrifugation, filtration and the like. In some examples, the extraction liquid may be evaporated leaving the capped particles. The capped particles may be washed, sized, heated or otherwise processed prior to, during or after separation from the extraction liquid. In certain embodiments, the extraction liquid may be used, optionally along with one or more solvents, as a carrier fluid to provide an ink, as discussed in more detail herein.

In accordance with certain examples, the capped particles may be dried to remove any residual liquids. For example, the capped particles may be dried in an oven, may be dried using a vacuum, or may be subjected to lyophilization to otherwise remove any residual extraction liquid and/or solvent. The dried, capped particles may be stored at room temperature optionally in a sealed container to prevent moisture entry.

In accordance with certain examples, the capped particles may be processed to remove the capping agent prior to use of the particles in an ink. The capping agent typically remains on the surface of the particles after the reaction, but the presence of a capping agent may be undesirable. For example, where it is desirable to use particles with the lowest level of organic contamination possible, it would be advantageous to remove the capping agent from the capped particles. In certain embodiments, the capped particles may be processed until the level of capping agent is reduced below about 2% by weight, more particularly reduced to below about 1% by weight, e.g., the capping agent is present at less than 0.5% or 0.1% by weight.

In accordance with certain examples, the particles disclosed herein may be used to provide alloys. In certain examples, the capped particles disclosed herein may be used to provide a core-shell structure where the metal of the capped particle acts as a shell and another metal or metal alloy would act as a core. For example, a tin-copper alloy may be used as a core and silver particles (capped or uncapped) may be used as a shell to provide a type of SAC alloy, e.g., a nano SAC alloy. The exact process used to produce the alloy may vary, and in certain examples the alloy may be produced by dissolving ions of other metals, e.g., $Sn^{2+}$, $Cu^{2+}$, etc., in a dispersion of uncapped silver particles. The mixture may be subjected to reduction or other steps to produce an alloy having selected properties. In certain examples, the alloys may be placed in a suitable solvent system to provide an ink suitable for use in printing applications, e.g., inkjet printing applications.

In accordance with certain examples, the produced particles may be dissolved in a solvent system to provide selected properties, e.g., a suitable viscosity and surface tension, such that the particles may be printed onto a substrate using inkjet printing. In certain examples, a selected amount of particles are dispersed in a carrier to provide an ink. The exact amount of the particles selected may vary, and typically a suitable amount of particles (either capped or uncapped) are used to provide a dispersion including about 5 weight percent particles to about 60 weight percent particles, more particularly about 5-30 weight percent particles, e.g., about 20-25 weight percent particles. In embodiments where capped particles are used, the amount of the capped particles used may be altered to account for the additional weight added by the capping agent. In other examples, a sufficient amount of particles are used to provide a desired viscosity for the dispersion. For example, the viscosity of the dispersion may vary depending on the method or devices that the ink is to be used in. In examples where the ink is intended to be used in spin coating applications, a sufficient amount of particles may be selected to provide an ink viscosity of about 0.25 cPs to about 2 cPs, more particularly about 0.5 cPs to about 1.5 cPs, e.g., about 1 cPs. In examples where the ink is intended to be used in inkjet printing applications, a sufficient amount of particles may be selected to provide an ink viscosity of about 5 cPs to about 20 cPs, more particularly about 7 cPs to about 15 cPs, e.g., about 8-10 or 8-9 cPs. Similarly, where the ink is intended to be used in spin coating applications, a sufficient amount of particles may be selected to provide a surface tension of about 18 dynes/cm to about 32 dynes/cm, more particularly about 20 dynes/cm to about 28 dynes/cm, e.g., about 24 dynes/cm. In examples where the ink is intended to be used in inkjet printing applications, a sufficient amount of particles may be selected to provide an ink viscosity of about 4 cPs to about 50 cPs, more particularly about 8 cPs to about 15 cPs, e.g., about 10 cPs. It will be within the ability of the person of ordinary skill in the art, given the benefit of this disclosure, to select suitable solvent systems for imparting a desired property to an ink.

In accordance with certain examples, the carrier of the ink may be one or more of the solvent systems disclosed herein that can effectively disperse the particles in a selected manner, e.g., spin coating, inkjet printing, paste printing, etc. In certain examples, the carrier is a solvent system that includes a first component and a second component. In certain examples, the dielectric constant of the first component is less than that of the second component. In some examples, the first component is substantially non-polar with a dielectric constant at 20° C. that is less than about 4, more particularly less than about 3 or less than about 2. In certain examples, the second component has a dielectric constant that is preferably greater than about 2, more preferably greater than about 3 or about 4, provided that the dielectric constant of the second component is typically greater than that of the first component.

In certain examples, the first component may be selected to provide for dispersion of the particles. The second component may be selected to provide the ability to adjust the viscosity and surface tension of the dispersion. Viscosity modifiers that dissolve in one or both of the first component and the second component may also be used. For example, typical viscosity modifiers that may be used include, but are not limited to, ethylene glycol, propylene glycol or other polyols. Upon heating, glycols should easily decompose and evaporate without compromising conductivity of the final product.

In accordance with certain examples, the solvent system may include at least two solvents with one solvent being a substantially non-polar molecule, e.g., a hydrocarbon, and the second solvent being a solvent that is more polar than the first solvent. In examples where a hydrocarbon solvent is used, the hydrocarbon may be saturated or unsaturated, may be straight-chain, branched, cyclic or take other forms. The solvent may also be a substituted hydrocarbon, e.g., a halocarbon, or may be an ether (either linear or cyclic), a furan or other substituted hydrocarbon that is substantially non-polar. In some examples, the substantially non-polar molecule of the first solvent may be benzene, toluene, xylene, mesitylene or a cyclic hydrocarbon that may include, for example, one or more phenyl groups or saturated or unsaturated cyclic hydrocarbons. Additional solvents for use as the first component of the solvent systems disclosed herein will be readily selected by the person of ordinary skill in the art, given the benefit of this disclosure.

In accordance with certain examples, the solvent system may also include a second component that is more polar than the first component. The second component may be a solvent that includes at least one hydroxyl, amino, sulfo, nitrile, carboxy or other group. In some examples, the second solvent may be an alcohol such as, for example, methanol, ethanol, 2-methoxyethanol, propanol, isopropanol, butanol, 2-butanol, pentanol, hexanol, heptanol, octanol or terpeniol. In other examples, the second solvent may include a cyclic alcohol, such as cyclohexanol. In some examples, the second solvent may be a ketone such as, for example, acetone, methylethylketone, methylisoamylketone, or methylisobutylketone. In yet other examples, the second solvent may include an amine, amide group or carboxyl group optionally with one or more hydroxyl groups. In additional examples, the second solvent may include one or more —SH groups optionally with one or more hydroxyl groups. In certain examples, the second solvent may be dimethylformamide, dimethylsulfoxide, N,N-dimethylacetamide, ethyl acetate, N-methyl-2-pyrrolidone, pyridine, tetramethyl urea, acetic acid or water. Additional solvents for use as the second component of the solvent systems disclosed herein will be readily selected by the person of ordinary skill in the art, given the benefit of this disclosure.

In certain examples, the solvent system may include a mixture of the first component and the second component at any desired ratio. In certain examples, the amounts of the first component and the second component that are used are selected to provide an ink viscosity of about 10-12 cPs at a printing temperature. In other examples, the amounts of the first component and the second component that are used are selected to provide an ink having a surface tension of about 30-32 dynes/cm. Illustrative ratios of first component:second component are 4:1, 3:1, 2:1, 1:1, 1:2, 1:3, 1:4, and any ratio in between these ratios.

In accordance with certain examples, the solvent system may include three or more solvents. The exact ratio of the solvents used typically depends on the desired properties of the ink. In certain configurations, the ratios of the solvent are selected to provide an ink that is amenable to disposition using inkjet printing applications. In some examples, the ratios of the solvents are selected to provide a viscosity of about 10-12 cPs and/or a surface tension of about 30-32 dynes/cm. It will be within the ability of the person of ordinary skill in the art, given the benefit of this disclosure, to select suitable ratios of solvents for use in a solvent system that includes three or more solvents.

In accordance with certain embodiments, a solvent system may be selected such that an ink used to produce a high-aspect ratio conductive pattern has a viscosity of about 10-12 cPs at a printing temperature. Inks that include a viscosity of about 10-12 cPs are especially useful in inkjet printing applications, such as those using, for example, piezoelectric printing heads from Spectra or Xaar. In some examples, the ink may include capped metal particles suspended in a suitable solvent system, e.g., a mixture of toluene, terpeniol and optionally xylene, to provide a viscosity of about 10-12 cPs. In certain examples, the ink may include capped silver particles, capped gold particles, or mixtures thereof.

In accordance with certain examples, a solvent system may be selected such that an ink used to produce a high-aspect ratio conductive pattern has a surface tension of about 30-32 dynes/cm at a printing temperature. Inks that include a surface tension of about 30-32 dynes/cm are especially useful in inkjet printing applications, such as those using, for example, piezoelectric printing heads from Spectra or Xaar. In some examples, the ink may include capped metal particles suspended in a suitable solvent system, e.g., a mixture of toluene, terpeniol and optionally xylene, to provide a surface tension of about 30-32 dynes/cm. In certain examples, the ink may include capped silver particles, capped gold particles, or mixtures thereof.

In accordance with certain examples, the inks disclosed herein may have both a viscosity of about 10-12 cPs and a surface tension of about 30-32 dynes/cm. To achieve both properties, the relative amounts of the components in the solvent system may be adjusted. In addition, more or less capped metal particles may be used to achieve a desired viscosity and a desired surface tension for the ink. The person of ordinary skill in the art, given the benefit of this disclosure, will be able to adjust the amounts of capped metal particles and the components in a solvent system to achieve desired physical properties.

In accordance with certain examples, an ink that is finely dispersed and stable at a printing temperature may be used to produce a high-aspect ratio conductive pattern. In certain examples, stability may be assessed by determining whether or not the capped metal particles precipitate out of solution. It is desired that the capped metal particles be suspended in the solvent system to facilitate transfer of the capped metal particles to a substrate during printing. Substantial precipitation of the capped metal particles may result in poor transfer of material from the printer to the substrate. To increase stability of the ink, one or more dispersants may be added to the ink. Illustrative dispersants include, but are not limited to, Solsperse 17000, 20000 and 39000 from Noveox Corp or Disperbyk 112, 117, 1250 from BYK.

In accordance with certain examples, the ink may be processed prior to use. In certain embodiments, the ink may be mixed with dyes, other inks or other materials prior to use. In other embodiments, the ink may be heated, screened, filtered or the like prior to use. In certain examples, the particles may be heated, screened, filtered or the like prior to disposition in a solvent system to provide an ink. In certain embodiments employing the capped particles disclosed herein, heating permits the particles to coalesce and form highly conductive lines or patterns that may be used, for example, in circuits, printed wiring boards and the like. Additional embodiments for disposing inks on a substrate to create a desired pattern will be readily selected by the person of ordinary skill in the art, given the benefit of this disclosure. Illustrative uses for articles produced using the inks disclosed herein include, but are not limited to, printed electrical circuits, radio frequency identification (RFID) antennas, solar cell wires, solar cell interconnect, battery electrodes, and reflective surfaces and mirrors.

In accordance with certain examples, the type and nature of the substrate depends, at least in part, on the desired device that is to be produced. For example, in application where a printed circuit board is produced, the substrate may be one or more cured or uncured prepregs. The substrates may be made from may different materials, including but not limited to, traditional silicon and also polymeric substrates such as for example, polyethylene, polypropylene, polyimide and polyester. These substrates are relatively inexpensive to make and provide good adhesion of electronic components. The substrate may include reinforcing fibers or whiskers, may include glasses, additives, foams, flame retardants and other materials to impart desired properties to the substrate.

In embodiments where an ink is subjected to heating, heating is typically performed using a hot-plate, oven (high temperature convection oven, reflow oven, IR oven, etc.), laser heating or other methods and devices that can increase the temperature of the particle dispersion or the ink. In certain examples, the ink may be heated to at least about 250° C. for 10-60 seconds, e.g., 250° C. for 30 seconds. In other examples, sequential heating may be performed such that the ink is heated at a first temperature for a selected time followed by heating at a second temperature for a selected time. For example, the ink may be heated at about 110-130° C. for 10-30 seconds, e.g., 120° C. for 20 seconds, followed by a second heating step at 250-300° C. for 10-60 seconds, e.g., 280° C. for 20 seconds. Subsequent to heating, the particles and inks may be subjected to other processing steps.

In accordance with certain examples, the inks disclosed herein may be used along with a suitable apparatus for disposal of the inks. While the exact method used to dispose the ink on a substrate is not critical, a non-impact printing device, such as, for example, an inkjet printer, may be used to print the ink onto a substrate. In embodiments where an inkjet printer is used, the inkjet printer includes an ink reservoir or cartridge that holds the ink. The ink cartridge is in fluid communication with a print head, which typically includes a series of nozzles that spray the ink onto the substrate. The inkjet printer may also include a suitable motor to move the print head to a desired position. One or more belts or chains may connect the motor to the print head. The inkjet printer may include stabilizer bars or supports to stabilize the print heat during the printing process. Illustrative inkjet printers suitable for use include, but are not limited to, those using or configured to use piezoelectric printing heads from Spectra or Xaar. Other suitable inkjet printers will be readily selected by the person of ordinary skill in the art, given the benefit of this disclosure.

In certain embodiments, one or more devices that includes at least one conductive line or pattern produced using the methods disclosed herein is provided. In certain examples, the device may be a conducting grid on a solar cell, a plasma display, a printed circuit board, a solar cell interconnect, an electronic circuit or other devices that could benefit from highly defined conductive lines or patterns.

In accordance with certain examples, a printed circuit board comprising a dielectric substrate and having at least one high-aspect ratio conductive pattern disposed on the dielectric substrate is disclosed. In certain examples, a printed circuit board comprises a dielectric substrate having an electrical conductor, e.g., a wiring layer, on one or both surfaces. Any portion or portions of the conductor may include a high-aspect ratio conductive pattern. In certain examples, the electrical conductor may be formed to have a predetermined pattern, with some portion, or all, of the electrical conductor being formed using the methods disclosed herein. In examples employing multiple electrical conductors, the conductors may be connected electrically with each other. In some examples, the dielectric substrate comprises a glass cloth or a glass non-woven fabric such as, for example, the illustrative glass cloths and glass non-woven fabrics discussed herein.

Figure 5:
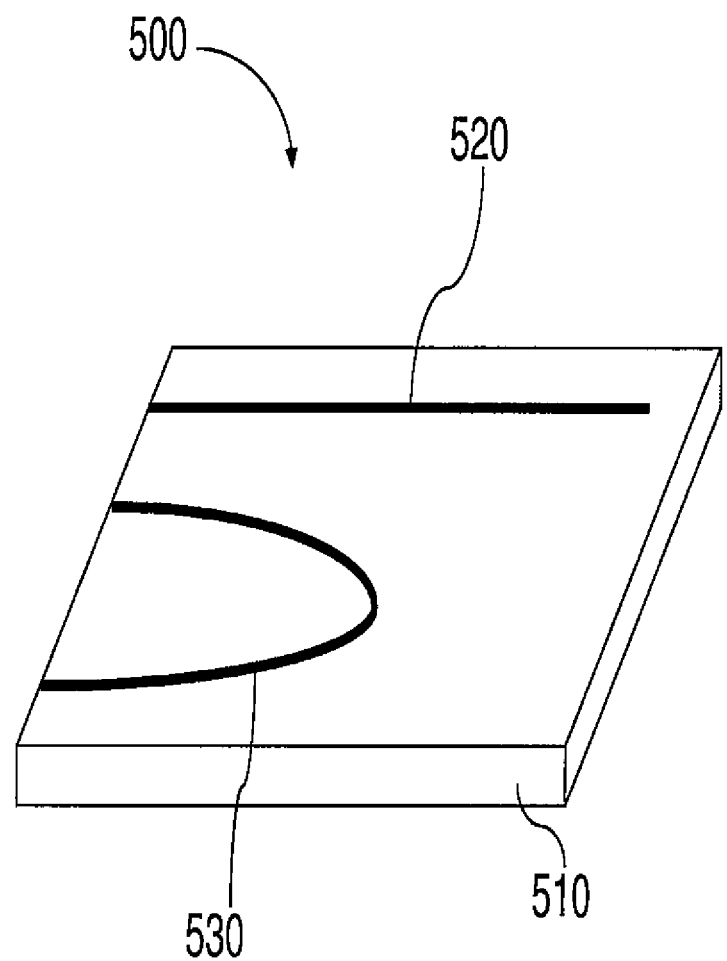
FIG. 5 is an example of a printed circuit board including a high-aspect ratio conductive pattern, in accordance with certain examples.

In accordance with certain examples, a high-aspect ratio conductive pattern disclosed herein may be disposed on one or more prepregs. A prepreg typically includes a substrate (e.g., woven or non-woven fibrous substrate) such as glass, quartz, polyester, polyamide, polypropylene, cellulose, nylon or acrylic fibers, low dielectric unidirectional tape, or woven cloth or non-woven fabric of interbonding fibers. Suitable low dielectric fibers include high strength fibers such as glass fibers, ceramic fibers and aramid fibers, which are commercially available. In certain examples, prepreg fibers may have a consistent fiber orientation. The prepreg may be impregnated with a composition, such as a flame retardant, and such prepregs may be cured by application of heat and pressure. The prepreg may be cured prior to disposition of a high-ratio conductive pattern, or may be disposed subsequent to the disposition of a high-ratio conductive pattern. In certain instances, it may be desirable to not cure the prepreg. Referring now to FIG. 5, prepreg 500 comprises a generally planar substrate 510 with a high-aspect ratio conductive pattern 520 disposed on or in substrate 510. In FIG. 5, the high-aspect ratio conductive pattern 520 is shown as a line, though as discussed herein, other shapes and configurations may be achieved, such as a semi-circular high-aspect ratio conductive pattern 530. The thickness of the substrate 510 can vary, and in certain examples, the substrate is about 1 mil to about 15 mils thick, more particularly, about 1 mil to about 10 mils thick, e.g., about 2-9, 3-8, 4-7 or 5-6 mils thick. It will be within the ability of the person of ordinary skill in the art, given the benefit of this disclosure, to select suitable thicknesses for prepreg substrates.

In accordance with certain examples, the conductive patterns 520 and 530 may be disposed on the substrate 510 using any of the methods disclosed herein. In certain examples, the conductive patterns may be disposed using inkjet printing or other suitable devices and methods.

In accordance with certain examples, a printed circuit board comprising one or more of the compositions disclosed herein is provided. Examples of printed circuit boards include a dielectric substrate having an electrically conductive layer, e.g., a wiring layer, on one or more surfaces. In some examples, the electrically conductive layer is formed to have a predetermined pattern. In examples using multiple electrically conductive layers, the layers may be connected electrically with each other. The exact nature of the dielectric substrate can vary, and exemplary materials for dielectric substrates include but are not limited to glass, woven and non-woven fabrics, and other suitable materials that can receive one or more of the compositions disclosed herein.

Several specific examples are disclosed below to facilitate a better understanding of the technology described herein. In all the examples disclosed below, unless otherwise noted, all formulations were ball milled for 48 hours and provided a stable dispersion of particles for weeks without visible precipitation.

Example 1

A batch of silver particles was prepared by adding 108 grams of silver nitrate to 200 millimeters (mL) of ethylene glycol to provide a silver nitrate concentration of 3.2 moles/Liter. The entire 200 mL solution was added to 1500 mL of ethanol to which 2750 mL toluene was added in order to obtain a single phase mixture (provided a 1:1.83 mixture of ethanol:toluene).

In a first reaction, 318.7 grams of hexadecylamine was added to the single phase mixture, and a single phase remained after stirring. To this clear solution, 250 mL of a sodium borohydride solution in N,N-Dimethyl formamide (11.349 grams of sodium borohydride dissolved in 250 mL of N,N-Dimethyl formamide) was added drop-wise as a reducing agent to form a dark yellowish brown solution of about 4.7 liters in volume. The reaction mixture was allowed to stir for 30 minutes at about 22° C., and capped silver particles were extracted by adding 20 L of methanol or 20 L of acetone. The capped particles were removed by separatory funnel followed by centrifugation at 500 rpm for 30 minutes using a Rousselet Robatel® RC 20 centrifuge. The capped particles were dried in a vacuum to obtain a free flowing powder of nanocrystalline capped silver particles having about 18% hexadecylamine.

In a second reaction, 24 grams of dodecylamine was added to the single phase mixture and a single phase remained after stirring. To this clear solution, 250 mL of a sodium borohydride solution in N,N-Dimethyl formamide (11.349 grams of sodium borohydride dissolved in 250 mL of N,N-Dimethyl formamide) was added drop-wise as a reducing agent to form a dark yellowish brown solution of about 4.7 liters in volume. The reaction mixture was allowed to stir for 30 minutes at about 22° C., and capped silver particles were extracted by adding 20 L of methanol or 20 L of acetone. The capped particles were removed by separatory funnel followed by centrifugation at 500 rpm for 30 minutes in a Rousselet Robatel® RC 20 centrifuge. The capped particles were dried in a vacuum to obtain a free flowing powder of nanocrystalline capped silver particles having about 8% dodecylamine.

Each of the capped particle samples was dispersed in toluene, and a clear absorption at 409-416 nm was observed using a Hewlett-Packard® UV-Visible Spectrophotometer (Model No.: HP8452A) and a 1 cm path length disposable cuvette. An absorbance at 409-416 nm absorption is typical of nanocrystalline silver.

Example 2

Depending on the applications for which the metal particles are intended, different loading rates may be used. The following loading rates have been used to produce particles. In parenthesis is the liquid used to extract the metal particles from the single phase solution.

| Sample | Percent Loading (%) |
|---|---|
| Ag-HDA (Methanol ppt) | 18.69 |
| Ag-HDA (Acetone ppt) | 2.63 |
| Ag-DDA (Methanol ppt) | 7.35 |
| Ag-DDA (Acetone ppt) | 2.50 |

Example 3

Capped particles were produced using the protocol described in Example 1 and with varying loading rates of hexadecylamine. Particles were produced that had 18% by weight hexadecylamine or 8% hexadecylamine. A commercial powder (70 nm in size) that was commercially available from Sigma-Aldrich and 40 nm powder (type 3) available from an industrial supplier (Nanodynamics, Inc. of Buffalo, N.Y.) were tested along with the two particle samples.

FIG. 5 shows thermo-gravimetric analysis of three different thin films produced using the three materials. Type one material was coated with 18% HDA, type 2 was coated with 8% HDA and type 3 was the commercially available powder with 2% of an organic coating. Three different silver inks were made by mixing or dispersing of one of the selected materials in toluene (about 6% solution by weight). Thin films were made on glass by spin coating the inks at similar conditions. The glass substrates with wet films were then heated at 200° C. for 100 seconds. Upon heating HDA and the solvent decomposed and evaporated to provide a surface of silver particles. Such particles easily and completely coalesced and the ink made of silver particles with 18% of HDA coating produced thin silvery and shiny films. Both of the inks made of silver nanopowder with only 8% HDA coating and made of commercially available produced dark and loose grayish films.

The conductivity of the films was measured by conventional 4-point probe meter (Lucas Labs model Pro4). The films made of 18% HDA coated nanopowder produced highly conductive films with the conductivity in the range of 30-40*$10^4$ S/cm, which was only slightly lower then the conductivity of the bulk silver (~62*$10^4$ S/cm). The films also have had very good adhesion to the glass substrate and easily passed tape and scratch tests usually used to evaluate the adhesion properties (ASTM D3359-02 dated Aug. 10, 2002).

Example 4

Metal particles prepared according to Example 1 above may be dispersed in toluene to provide an ink. In one illustration, metal particles may be dispersed in toluene to provide 20 weight percent particles and a solution viscosity of about 1 cPs. The ink may be applied to a substrate using spin coating, for example, or may be used in spin coating applications. The particles may be silver or gold particles or other illustrative metals disclosed herein.

Example 5

Metal particles prepared according to Example 1 above may be dispersed in IsoPar® G solvent to provide an ink. In one illustration, metal particles may be dispersed in IsoPar® G solvent to provide 20 weight percent particles and a solution viscosity of about 1 cPs. The ink may be applied to a substrate using spin coating, for example, or may be used in spin coating applications. The particles may be silver or gold particles or other illustrative metals disclosed herein.

Example 6

Metal particles prepared according to Example 1 above may be dispersed in an organic solvent mixture to provide an ink. In one illustration, metal particles may be dispersed in toluene/Isopar® L solvent/Isopar® V solvent (1:2:8) to provide 20 weight percent particles and a solution viscosity of about 8-9 cPs. The ink may be applied to a substrate using inkjet printing devices and methods, for example, or may be used in inkjet applications. The particles may be silver or gold particles or other illustrative metals disclosed herein.

Example 7

Metal particles prepared according to Example 1 above may be dispersed in an organic solvent mixture to provide an ink. In one illustration, metal particles may be dispersed in toluene/Isopar® V solvent (1:2) and 3 weight percent polyisobutylene (PIB) to provide 20 weight percent particles and a solution viscosity of about 8-9 cPs. The ink may be applied to a substrate using inkjet printing devices and methods, for example, or may be used in inkjet applications. The particles may be silver or gold particles or other illustrative metals disclosed herein.

Example 8

Metal particles prepared according to Example 1 above may be dispersed in an organic solvent mixture to provide an ink. In one illustration, metal particles may be dispersed in toluene/Isopar® V solvent (1:1) to provide 80 weight percent particles. The ink may be applied to a substrate using paste printing methods, for example, or may be used in past printing applications. The particles may be silver or gold particles or other illustrative metals disclosed herein.

Example 9

Several inks were prepared by placing capped silver particles in toluene. Each of the capped silver particles used in the inks was prepared using the protocol of Example 1 and extracted in methanol once unless otherwise noted. The various inks are shown in the table below. The silver particles in Ink B were washed in methanol twice, and the silver particles in Ink C were extracted using acetone. Inks F and G were made from commercially available silver nanoparticles. In particular, Inks F and G were made by dispersion of silver powder in toluene in the weight ratio 1:5. The ink was sonicated for 60 min prior to making the films. Ink F was made from Aldrich powder (Cat#57583-2), and Ink G was made using Nanodynamics Product Name NDSilver (Lot #31-0048).

| Ink | Capping Agent | Amount of Capping Agent (%) |
| --- | --- | --- |
| Ink A | Hexadecylamine | 18 |
| Ink B | Hexadecylamine | 12-14 |
| Ink C | Hexadecylamine | 2-3 |
| Ink D | Dodecylamine | 8 |
| Ink E | Octylamine | 5-6 |
| Ink F (Commercial Product 1) | NA | 4 |
| Ink G (Commercial Product 2) | NA | 0.5 |

Each of the inks was used in a spin coating process to form a film. To form each film, each ink was heated on a hot plate at 250° C. for 30 seconds. After heating, each ink was spin coated onto a glass substrate using a KW-4A spin coater commercially available from Chemat Technology (Northridge, Calif.). The coating procedure involved coating at 600 rpm for 9 seconds followed by coating at 1000 rpm for 30 seconds. The resulting properties of each film are shown below. Adhesion was tested by tape test according to ASTM D3359-02 dated Aug. 10, 2002. The resistivity of each film was measured using a 4-point probe (Lucas Labs).

| Ink | Film Description | Adhesion | Resistivity ($\mu\Omega \times cm$) |
| --- | --- | --- | --- |
| Ink A | Shiny, smooth and uniform (FIG. 6A). | Very good, passed tape test | 3-4 |
| Ink B | Shiny, uneven with pinholes (FIG. 6B) | Good | 3-4 |
| Ink C | Did not form a film | | $\infty$ |
| Ink D | Shiny, uneven, numerous pinholes (FIG. 6C) | Poor | 20-30 |
| Ink E | Does not form a film, crumbles on heating | | $\infty$ |
| Ink F | Does not form a film, grey agglomerates present Does not form a film | | $\infty$ |

Example 10

A composition was prepared comprising the following materials: a sufficient amount of nanosilver capped with hexadecylamine (produced as described above in Example 1) was dispersed in a solvent system that included 1 part toluene, 4 parts terpeniol and 4 parts xylene to provide 20 weight percent nanosilver coated with hexadecylamine in the dispersion.

The surface tension and the viscosity of the dispersion were measured. Surface tension was measured using a Capillary Surface Tension Apparatus from Fisher. Viscosity was measured using a Brookfield Digital Viscometer DV-11. The surface tension was found to be 30 dynes/cm, and the viscosity was found to be 10 cPs.

Example 11

A composition was prepared comprising the following materials: a sufficient amount of nanosilver capped with hexadecylamine (produced as described in Example 1) was dispersed in a solvent system that included 4 parts toluene, 1 part terpeniol, 4 parts xylene and 0.1 g/L ethylene glycol to provide 20 weight percent nanosilver coated with hexadecylamine in the dispersion.

The surface tension and the viscosity of the dispersion were measured as described in Example 10. The surface tension was found to be 32 dynes/cm, and the viscosity was found to be 14 cPs.

Example 12

A composition was prepared comprising the following materials: a sufficient amount of nanosilver capped with dodecylamine (produced as described in Example 1) was dispersed in a solvent system that included 4 parts butanol and 1 part toluene to provide 20 weight percent nanosilver coated with dodecylamine in the dispersion. The surface tension and the viscosity of the dispersion were measured as described in Example 10. The surface tension was found to be 30 dynes/cm, and the viscosity was found to be 10 cPs.

When introducing elements of the examples disclosed herein, the articles "a," "an," "the" and "said" are intended to mean that there are one or more of the elements. The terms "comprising," "including" and "having" are intended to be open-ended and mean that there may be additional elements other than the listed elements. It will be recognized by the person of ordinary skill in the art, given the benefit of this disclosure, that various components of the examples can be interchanged or substituted with various components in other examples.

Although certain aspects, examples and embodiments have been described above, it will be recognized by the person of ordinary skill in the art, given the benefit of this disclosure, that additions, substitutions, modifications, and alterations of the disclosed illustrative aspects, examples and embodiments are possible.

What is claimed is:

1. A device comprising at least one high-aspect ratio conductive pattern disposed thereon, wherein the device comprises a substrate and wherein the high aspect ratio conductive pattern is produced by:
   a. disposing a support layer on the substrate defining a spacing having an effective height;
   b. disposing a conductive material between the defined spacing of the support layer, wherein the conductive material comprises metal particles, said metal particles comprising a metal or a metal salt capped with a capping agent, wherein the capping agent has a molecular weight of at least about 100 g/mol; and
   c. removing the support;
   wherein further support layers can be disposed followed by disposing of additional conductive material to increase the effective height of the high aspect ratio conductive pattern, prior to removing the support.

2. The device of claim 1 in which the conductive pattern is a conductive line.

3. The device of claim 1, in which the capped metal particles provide a conductivity of at least about $30*10^4$ S/cm.

4. The device of claim 1, in which the capped metal particles are one or more members selected from the group consisting of silver, gold, copper, nickel, platinum, palladium, and iron.

5. The device of claim 1, wherein the capping agent is selected from the group consisting of organic amines, thiols having 12 or more carbon atoms, and pyridine-based capping agents.

6. The device of claim 5, wherein the capping agent comprises hexadecylamine.

* * * * *